United States Patent [19]

Rothenberg

[11] Patent Number: 4,785,908

[45] Date of Patent: Nov. 22, 1988

[54] VENTED LOUDSPEAKER

[76] Inventor: Richard L. Rothenberg, 52 Maple St., Florence, Mass. 01060

[21] Appl. No.: 135,840

[22] Filed: Dec. 21, 1987

[51] Int. Cl.[4] .................. H05K 5/00

[52] U.S. Cl. .................. 181/156; 181/199

[58] Field of Search .................. 181/156, 199, 153, 154, 181/145, 148

[56] References Cited

U.S. PATENT DOCUMENTS 3,443,600 5/1969 Viova et al. .................. 181/153 X 4,475,620 10/1984 Carlsson .................. 181/154 X 4,482,026 11/1984 Stehlin, Jr. .................. 181/156 X 4,621,708 11/1986 Potter .................. 181/145 X

*Primary Examiner*—B. R. Fuller

*Attorney, Agent, or Firm*—Jacobs and Jacobs

[57] ABSTRACT

A vented louspeaker has a speaker and a vent tube within the loudspeaker enclosure, the vent tube being arranged obliquely to the wall on which it is mounted and being longer than the distance between that wall and the opposite wall.

29 Claims, 2 Drawing Sheets

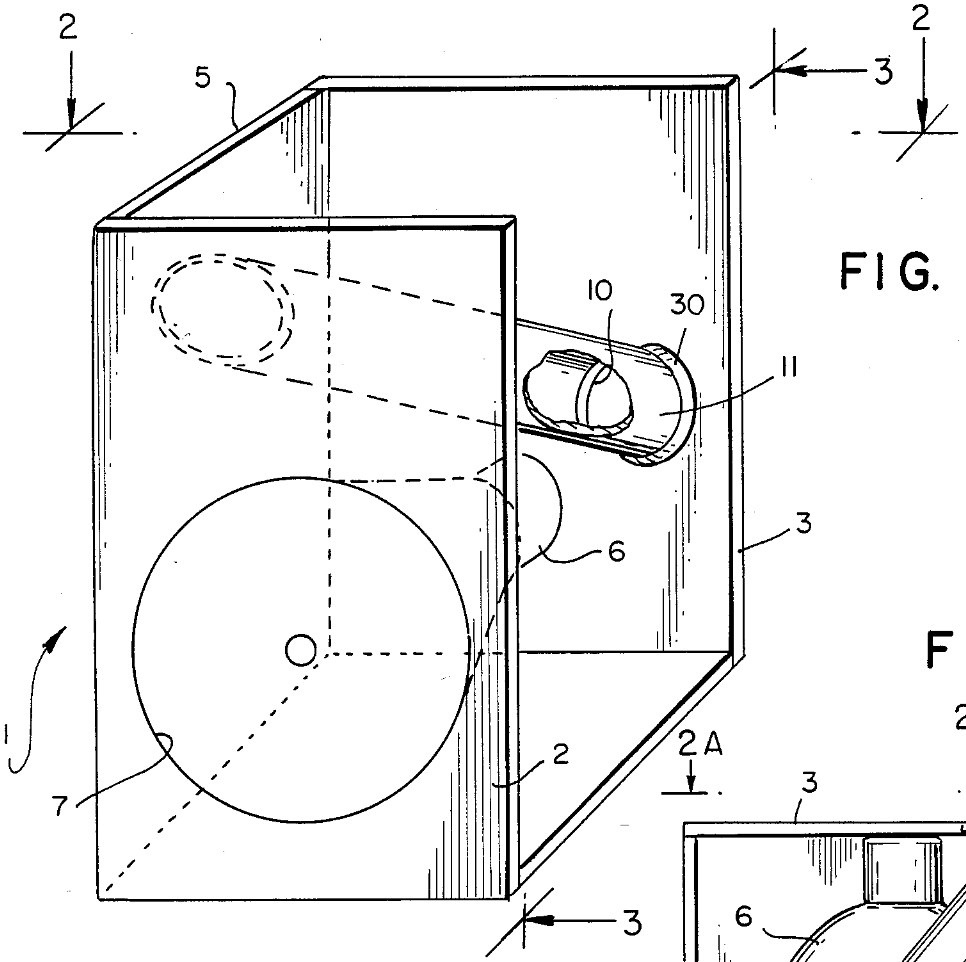
FIG. 1
FIG. 2
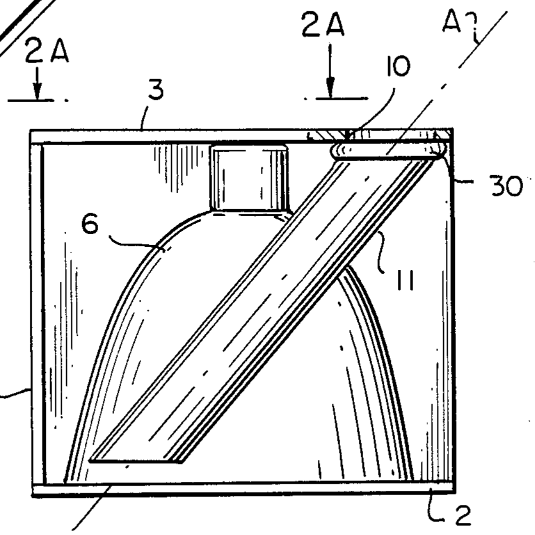
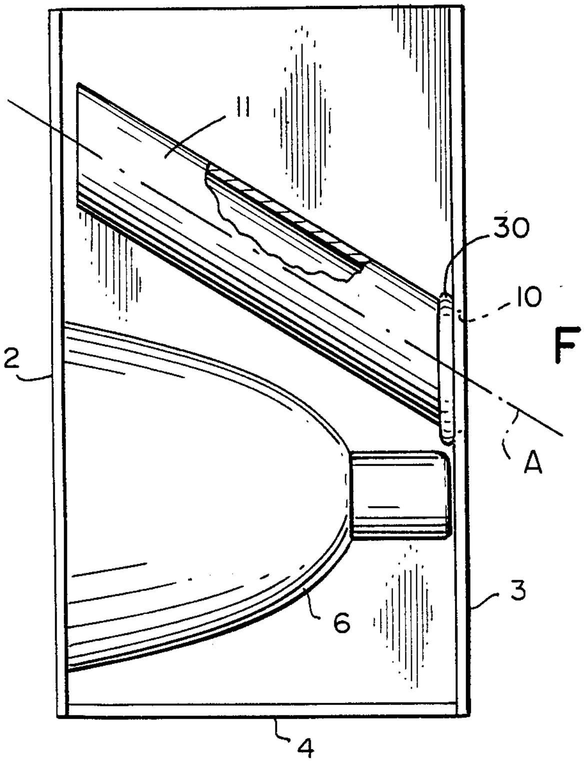
FIG. 3
FIG. 2A
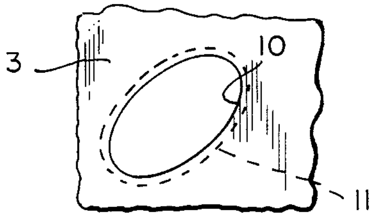

VENTED LOUDSPEAKER

The present invention relates to loudspeakers, and more particularly to vented loudspeakers.

Vented loudspeakers are loudspeakers that are provided with vent tubes to improve the response of the loudspeaker, particularly at low frequencies. The vent tubes, generally PVC tubes of circular cross-section, are mounted on one wall of the loudspeaker enclosure, the wall having an aperture therein for outward projection of sound from the vent tube and through the aperture. The length of the vent tube is a function of the radius of the vent tube such that a larger vent radius requires a longer vent tube. Generally speaking, it is desired to use a vent tube having as large a radius as possible.

Until now, vent tubes have been mounted perpendicular to the apertured wall of the speaker, which has placed a limit on the maximum vent tube length and hence on the maximum vent tube radius. Speaker Builder, No. 2 (1981), Edward T. Dell, Jr., Peterborough, N.H., page 20, states "For a given system, the maximum allowable vent length must obviously be somewhat shorter than the box dimension parallel to the tube; so the vent radius is indirectly limited by the box dimensions".

The present invention overcomes this limitation on the vent tube length and radius by mounting a straight vent tube with its axis at an oblique angle with respect to the apertured wall, (i.e. neither parallel nor perpendicular to the wall), the length of the vent tube being greater than the distance between the apertured wall and the opposite wall. Preferably, the angle is substantially about 40°.

In particular, the present invention provides a vented loudspeaker which comprises an enclosure having top, bottom, front, rear and opposed side walls, one of the walls having an aperture therein and one of the walls having an opening therein, a speaker within the enclosure and mounted on the wall having the opening for outward projection of sound through the opening, and an elongated, straight vent tube within the enclosure and mounted on the apertured wall for outward projection of sound through the aperture, the vent tube being arranged with its axis at an oblique angle with respect to the apertured wall and extending to, but spaced from, the wall opposite the apertured wall, the length of the vent tube being greater than the distance between the apertured wall and the opposite wall.

The use of the inclined, straight vent tube provides a vent tube aperture of larger area than the cross-section of the vent tube, which is desirable. However, the area of the vent tube aperture must not be too large, the desired area being empirically determined.

The apertured wall to which the vent tube is mounted may be any wall, such as the front, rear or side wall. Usually, the apertured wall will be selected to provide the longest length for the vent tube. The axis of the vent tube may be disposed in a horizontal plane or a vertical plane, or the vent tube axis may be disposed obliquely to both the horizontal and vertical. Preferably, the vent tube is flush mounted on, or mounted in a counterbore in, the inner surface of the apertured wall to which it is attached. It is presently preferred that the apertured wall be the front or rear wall.

The present invention is illustrated in terms of its preferred embodiments in the accompanying drawings, in which:

FIG. 1 is a perspective view of the vented loudspeaker of my invention, with the top and side walls removed for clarity;

FIG. 2 is a top view of the loudspeaker of FIG. 1 viewed in the direction of lines 2—2 in FIG. 1;

FIG. 2A is a detail view of the rear wall of the loudspeaker as viewed in the direction of lines 2A—2A in FIG. 2;

FIG. 3 is a side elevational view of the loudspeaker of FIG. 1 viewed in the direction of lines 3—3 in FIG. 1;

Figure 5:
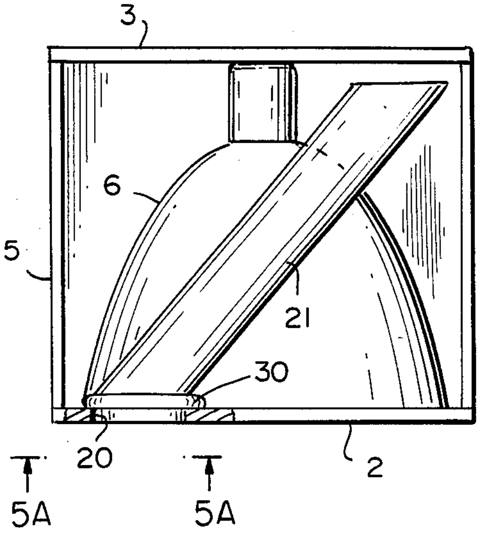
Figure 5A:
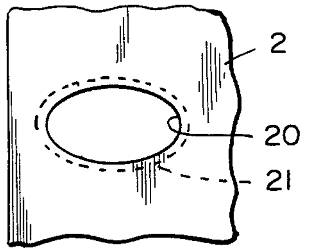
FIG. 5A is a detail view similar to FIG. 2A as viewed in the direction of lines 5A—5A in FIG. 5.
Figure 7:
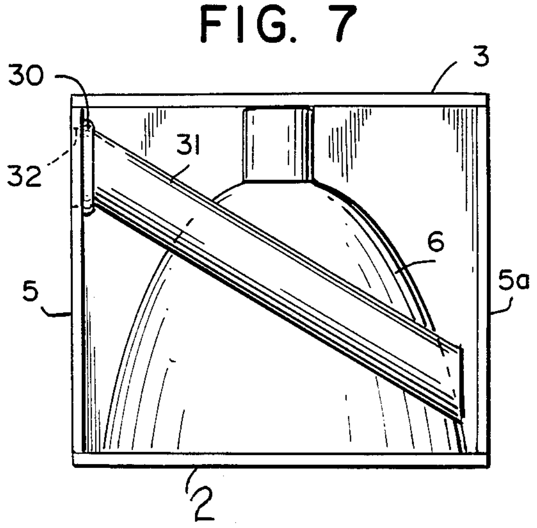

FIG. 7 a view similar to FIGS. 2 and 5 of another embodiment of the invention.

Referring to the drawings, FIG. 1 shows a loudspeaker having a housing or enclosure 1 comprising front wall 2, rear wall 3, bottom wall 4 and side wall 5. The opposed side wall and top wall have been omitted for clarity. As is known, the six walls form an enclosure 1 that has no air passages other than vent aperture 10 formed in the rear wall 3.

Mounted in the interior of the enclosure 1 is a speaker 6, which projects sound outwardly through an opening 7 formed in the front wall 2. When enclosure 1 has only one speaker 6, the speaker 6 will be a woofer or other speaker designed to reproduce sound of low to moderately low frequencies. When it is desired to provide a full range speaker system, other driving elements, such as mid-range speakers and/or tweeters, will be included. For simplicity, enclosure 1 is shown with only one speaker 6, such as provided with a subwoofer for bass augmentation only, which would be used with satellite speaker systems covering the remainder of the audible spectrum. When mid range and/or tweeter elements (not shown) are used, they may be mounted in enclosure 1 in accordance with known techniques.

Vent tube 11, which projects sound outwardly through aperture 10, is arranged obliquely to the horizontal and vertical, with the vent tube axis A (FIGS. 2 and 3) making an angle of substantially about 40° with respect to the rear wall 3. Since the length of vent tube 11 is longer than the distance between walls 2 and 3, the radius of vent tube 11 may be larger than if the vent tube 11 were perpendicular to walls 2,3, and hence an improved bass response is provided as compared to prior art systems.

Vent tube 11 extends toward but is spaced from the front wall 2. It is presently preferred to position the free end of vent tube 10 about one inch from the front wall 2, but the actual spacing chosen for a given speaker enclosure will be empirically determined. In general, a larger distance between the free end and the adjacent wall provides for more efficient performance of the vent tube, particularly for larger speaker systems featuring lower frequency reproduction. On the other hand, too great a spacing may unduly shorten the desired length of the vent tube 11. The free end of the vent tube will preferably be at the same angle with respect to the vent tube axis as the angle between the vent tube axis and the apertured wall to which the vent tube is attached, since this generally provides the best acoustical results.

Figure 4:
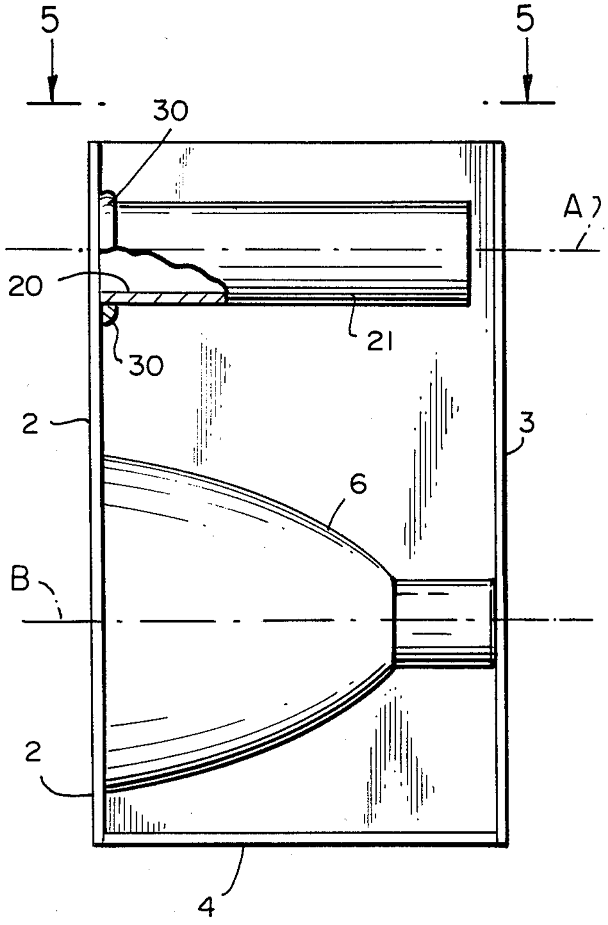
FIGS. 4 and 5 are views similar to FIGS. 2 and 3, respectively, of another embodiment of the invention.

FIGS. 4 and 5 show enclosure 1 provided with a vent aperture 20 in front wall 2 and a vent tube 21 extending from the front wall 2 toward but spaced from rear wall 3. In FIGS. 4 and 5, the vent tube 21 lies in a horizontal plane when the axis B of speaker 6 is in its normally horizontal position.

In FIGS. 1–5, the vent tube 11 or 21 is flush mounted to the inner surface of rear wall 3 or front wall 2, respectively.

Figure 6:
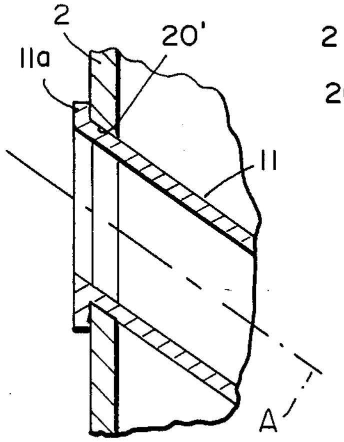
FIG. 6 is a detail view, in section, of another embodiment of the invention.
Figure 6A:
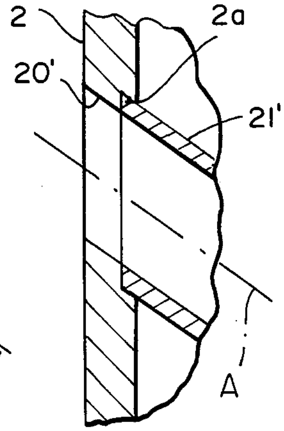
FIG. 6A is a view similar to FIG. 6 of another embodiment of the invention.

FIGS. 6 and 6A show vent tubes 11' and 21', respectively, mounted in the front wall 2 and arranged with the vent tube axis A lying in a vertical plane.

As shown in FIG. 6, the vent tube 11' may extend through the aperture 20', with the lip or flange 11a adhesively secured to wall 2. As is known, a flush mounted vent tube need only be sealed at the inner surface of the apertured wall to which it is attached. In the arrangement shown in FIG. 6, the vent tube 11' is sealed by securing the lip 11a to the outer surface of the wall 2. In FIGS. 1–5, a seal 30 is formed by the use of hot melt glue as conventionally used.

FIG. 6A shows the vent tube 21' adhesively mounted in a counterbore 2a in the bore 20' so that the vent tube 21' is partially recessed in wall 2. A recess of from about ⅛ to ⅜ inch has been found to be satisfactory. The use of counterbore a makes it more convenient to mount a vent tube in a wall. FIG. 7 shows a vent tube 31 arranged at an angle of from about 35° to about 45°, preferably substantially about 40°, with respect to side wall 5 and extending to but spaced from the opposed side wall 5a. Side wall 5 is provided with vent aperture 32.

It is presently preferred to adhesively secure the vent tube to the wall by means of hot melt glue to provide stability and reduce self resonance. However, it may be suitable simply to press fit the vent tube into the aperture in the wall, although this is not presently preferred.

As is known the vent tube may be of any desired cross-section and material. For convenience, plastic pipe, such as PVC or ABS pipe, of circular cross-section may be used.

To produce the loudspeaker of the present invention, the desired dimensions and materials for speaker 6 are selected and an enclosure 1 is built for that speaker using conventional techniques, such as detailed in Loudspeaker Design Cookbook, Vance Dickason, Marshall Jones Co., Francestown, N.H., 1987, and Speaker Builder. The length of the vent tube is then selected to provide the greatest diameter of the vent tube, taking into account the longest length possible for the geometry of the enclosure and also taking into account internal obstructions, such as speaker parts. Preferably, the vent tube will be disposed with its axis at an angle of from about 35° to about 45° to the front or rear wall. While the angle may be less than 35° or more than 45°, such as from about 20° to about 60°, the advantages of the invention, i.e. an improvement in the sound qualities, are optimized at the preferred angle of from about 35° to about 45°. The axis of the vent tube may be disposed in a horizontal or vertical plane or it may be oblique to the horizontal and vertical.

With the maximum allowable length of the vent tube thus selected, the radius of the vent tube is provided in accordance with known equations. For example, for a vent tube of circular cross-section that is flush-mounted on the apertured wall, the length (Lv) and radius (R) of the vent tube are related as follows:

$$L_v = 1.463\times 10^7 R^2 - 1.463R)/(f_B V_B)$$

where $L_v$ = length in inches $f_B$ = tuning frequency in $H_z$ $V_B$ = volume of the enclosure in cubic inches R = radius in inches Both Loudspeaker Design Cookbook and Speaker Builder describe in detail how to use the above equation to obtain a vent tube.

The location of the vent tube in the loudspeaker of the invention will also be guided by known techniques. Preferably, the vent tube will be mounted on the front or rear wall of the enclosure.

In a preferred embodiment of the invention, the enclosure of the speaker system was 11¼ inches high, 6¾ inches wide and 7 inches deep in which were mounted a 5¼ inch polypropylene cone woofer and a ¾ inch polycarbonate dome tweeter. A 1½ inch diameter straight vent tube was flush mounted in the rear wall at an angle of about 40° to the rear wall to provide an oval aperture of 1½×2⅝ inches. In lab tests conducted by an independent acoustical laboratory retained by Stereo Review Magazine, this mini-speaker system had an octave-to-octave energy balance from 100 to 10,000 Hz that was close to the balance of the lab's full size reference speakers. The enclosure had no other air passage except the oval aperture in the rear wall.

I claim:

1. A vented loudspeaker, which comprises an enclosure having top, bottom, front, rear and opposed side walls, one of said walls having an aperture therein and one of said walls having an opening therein, a speaker within said enclosure and mounted on said wall having said opening for outward projection of sound through said opening, and an elongated, straight vent tube within said enclosure and mounted on said apertured wall for outward projection of sound through said aperture, said vent tube having a longitudinally extending axis, said vent tube being arranged with said axis at an oblique angle with respect to said apertured wall and extending to, but spaced from, a said wall opposite said apertured wall, said vent tube having a length greater than a distance between said apertured wall and said opposite wall.

2. The loudspeaker according to claim 1, wherein said apertured wall is said front wall, said vent tube extending from said front wall to said rear wall.

3. The loudspeaker according to claim 1, wherein said apertured wall is said rear wall, said vent tube extending from said rear wall to said front wall.

4. The loudspeaker according to claim 1, wherein said apertured wall is a side wall.

5. The loudspeaker according to claim 1, wherein said vent tube is normally disposed with said axis lying in a horizontal or vertical plane.

6. The loudspeaker according to claim 1, wherein said vent tube is normally disposed with said axis oblique to both a horizontal and a vertical plane.

7. The loudspeaker according to claim 1, wherein said apertured wall has an inner and outer surface, said vent tube being mounted flush with said inner surface of said apertured wall.

8. The loudspeaker according to claim 1, wherein said angle is from about 20° to about 60°.

9. The loudspeaker according to claim 2, wherein said angle is from about 35° to about 45°.

10. The loudspeaker according to claim 1, wherein said angle is substantially about 40°.

11. The loudspeaker according to claim 4, wherein said angle is substantially about 40°.

12. The loudspeaker according to claim 5, wherein said angle is substantially about 40°.

13. The loudspeaker according to claim 6, wherein said angle is substantially about 40°.

14. The loudspeaker according to claim 7, wherein said angle is substantially about 40°.

15. The loudspeaker according to claim 10, wherein said vent tube has a circular cross-section.

16. The loudspeaker according to claim 11, wherein said vent tube has a circular cross-section.

17. The loudspeaker according to claim 12, wherein said vent tube has a circular cross-section.

18. The loudspeaker according to claim 13, wherein said vent tube has a circular cross-section.

19. The loudspeaker according to claim 14, wherein said vent tube has a circular cross-section.

20. The loudspeaker according to claim 2, wherein said angle is substantially about 40°.

21. The loudspeaker according to claim 20, wherein said vent tube has a circular cross-section.

22. The loudspeaker according to claim 3, wherein said angle is substantially about 40°.

23. The loudspeaker according to claim 22, wherein said vent tube has a circular cross-section.

24. The loudspeaker according to claim 1, wherein said apertured wall has an inner and an outer surface, the inner surface of said apertured wall is counterbored to provide a recess surrounding said aperture, and said vent tube is mounted in said recess.

25. The loudspeaker according to claim 24, wherein said angle is substantially about 40°.

26. The loudspeaker according to claim 25, wherein said vent tube has a circular cross-section.

27. The loudspeaker according to claim 1, wherein said vent tube extends through said aperture and has a projecting lip extending circumstantially around said vent tube.

28. The loudspeaker according to claim 22, wherein said angle is substantially about 40°.

29. The loudspeaker according to claim 28, wherein said vent tube has a circular cross-section.

* * * * *